United States Patent
Kang et al.

(10) Patent No.: US 7,002,364 B2
(45) Date of Patent: Feb. 21, 2006

(54) SEMICONDUCTOR DEVICE FOR REDUCING THE NUMBER OF PROBING PAD USED DURING WAFER TEST AND METHOD FOR TESTING THE SAME

(75) Inventors: Tae Jin Kang, Ichon-shi (KR); Woon Bok Lee, Yongin-shi (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 140 days.

(21) Appl. No.: 10/738,691

(22) Filed: Dec. 17, 2003

(65) Prior Publication Data
US 2004/0257106 A1 Dec. 23, 2004

(30) Foreign Application Priority Data
Jun. 23, 2003 (KR) ................. 10-2003-0040543

(51) Int. Cl.
*G01R 31/28* (2006.01)

(52) U.S. Cl. ...................... 324/763; 324/765
(58) Field of Classification Search ............. 324/763, 324/765, 754, 758, 760; 438/17, 18; 714/733, 714/734; 257/48
See application file for complete search history.

(56) References Cited

U.S. PATENT DOCUMENTS 4,339,710 A * 7/1982 Hapke ................. 324/763
4,956,602 A * 9/1990 Parrish ................. 324/537
4,961,053 A * 10/1990 Krug ................... 324/537
5,389,556 A * 2/1995 Rostoker et al. ......... 438/17
5,399,505 A * 3/1995 Dasse et al. ............ 438/17
5,469,075 A * 11/1995 Oke et al. ............. 324/763
5,796,266 A * 8/1998 Wright et al. .......... 324/763

FOREIGN PATENT DOCUMENTS

JP         2183551       7/1990
KR   2000-0014072    3/2000

OTHER PUBLICATIONS

Office Action from the Korean Patent Office dated Apr. 18, 2005 (3 pages).

* cited by examiner

*Primary Examiner*—Ernest Karlsen
(74) *Attorney, Agent, or Firm*—Marshall, Gerstein & Borun LLP (57) ABSTRACT

The present invention relates to a semiconductor device and a method for testing the same capable of reducing the number of probing pads used during wafer test. The semiconductor device includes a select circuit connected between a plurality of internal circuits to be tested and a single probing pad, for transmitting test signals inputted from the probing pads to any one of the plurality of the internal circuits according to a test mode signal generated in a wafer test mode. It is possible to reduce the number of the probing pads in the integrated circuit used for connection to a probe for contact of a probe card during wafer test. It is therefore possible to reduce test time.

53 Claims, 7 Drawing Sheets

SEMICONDUCTOR DEVICE FOR REDUCING THE NUMBER OF PROBING PAD USED DURING WAFER TEST AND METHOD FOR TESTING THE SAME

BACKGROUND

1. Technical Field

A semiconductor device, a method for testing the same and a test system are disclosed that are capable of reducing the number of probing pads used during a wafer test.

2. Discussion of Related Art

Generally, integrated circuits of a semiconductor device are formed on a semiconductor wafer in the form of a die and then packaged. In order to avoid packaging defective integrated circuits, it is preferred to test the integrated circuits on each wafer. The testing of the integrated circuits include a series of transmitting a test signal to an input terminal, and then monitoring an output signal generated by the integrated circuit and outputted through an output terminal in order to decide whether the integrated circuit operates as expected.

A typical integrated circuit test system includes 'a test head' having a circuit board for implementing a set of test channels. Each of the test channels includes the input channel for providing the test signal to the input terminal of the integrated circuit and the output channel for receiving the output signal outputting from the output terminal of the integrated circuit. A pad is formed in the integrated circuit so that the pad is interconnected to the test channel through a contact needle of the probe card. In other words, an input/output of the test signal is accomplished between the integrated circuit and the test channel through the pad.

In general, a single test channel is interconnected through a single pad and a contact chip of the probe card. Further, the number of the test channels in view of technical limitations of the test system is smaller than the number of pads of the integrated circuit. That is, the number of pads on the wafer equals the number of pads on the die times the number of dies on the wafer. Accordingly, the number of pads by far surpasses the number of test channels of the test system. Therefore, a lot of time is needed to test all of the integrated circuits on the wafer using a single test system.

SUMMARY OF THE DISCLOSURE

A reduction in the number of probing pads for an integrated circuit is disclosed that are used for electrical connection with a contact probe of a probe card during wafer test using a test system.

Further, a reduction of the test time is provided by using a limited number of test channels for testing a wafer and using a test system to test a circuit having a number of pads greater than the test channel.

According to a preferred embodiment, there is provided a semiconductor device, which includes a plurality of internal circuit blocks provided on a wafer and each having a plurality of internal circuits, and a select circuit unit for selectively transmitting test signals inputted through respective probing pads corresponding to the internal circuit blocks to any one of the internal circuits in a corresponding internal circuit block according to test mode signals generated during wafer test.

A method of testing a wafer is disclosed which includes, dividing a plurality of internal circuits provided on the wafer into a plurality of internal circuit blocks, selectively transmitting test signals inputted through respective probing pads provided to correspond to respective blocks to an internal circuit of any one of corresponding internal circuit blocks according to a test mode signal generated during wafer test, and testing the operation of a corresponding internal circuit operated according to the transmitted test signal through the probing pads, by monitoring it.

DETAILED DESCRIPTION OF PREFERRED EMBODIMENTS

Now the preferred embodiments will be described with reference to the accompanying drawings. Since preferred embodiments are provided for the purpose that the ordinary skilled in the art are able to understand the disclosure, they may be modified in various manners and the scope of this disclosure is not limited by the preferred embodiments described herein.

Figure 1:
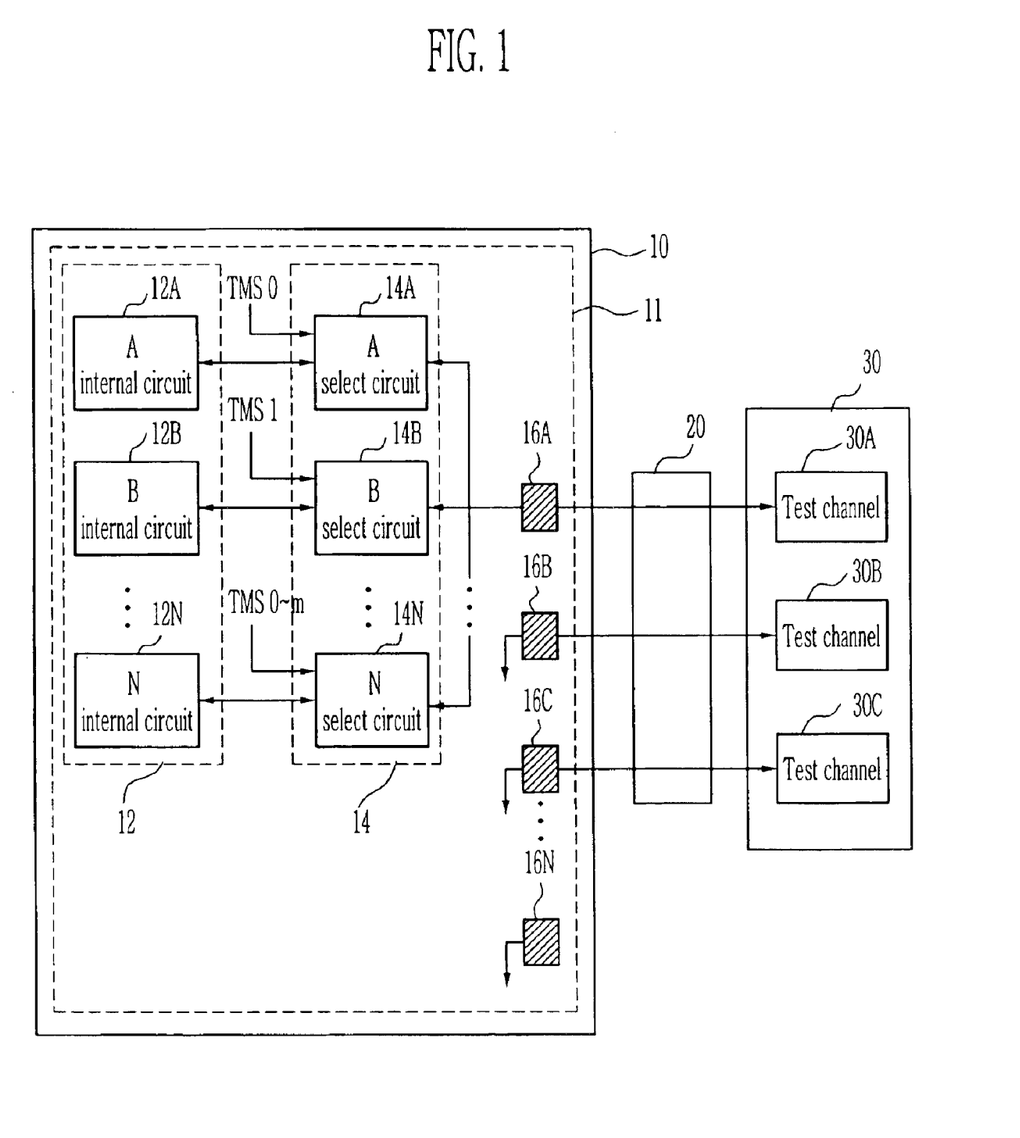
FIG. 1 is a block diagram illustrating a semiconductor device according to a preferred embodiment of the present invention.

Referring to FIG. 1, the semiconductor device includes a select circuit unit 14 for testing a plurality of internal circuits 12A to 12N using a single probing pad 16A during wafer test. The select circuit unit 14 is synchronized to test mode signals (TMS0 to TMSm) during wafer test to transmit a test signal supplied from a test channel 30A of a test system 30 to the internal circuits 12A to 12N through the pad 16A. Further, the select circuit unit 14 selects one of output signals generated from the respective internal circuits 12A to 12N, in response to the test mode signal, to transmit the selected out signal to the pad 16A.

The internal circuits 12A to 12N constitute a single block. Each block corresponds to each of the probing pads 16A to 16N one-to-one. The number of the internal circuits included in each block is decided depending on the design. Furthermore, the internal circuits 12A to 12N are operated according to the test signal transmitted from the probing pad 16A during wafer test. The operating status of these internal circuits 12A to 12N is transmitted to the test system 30 through the probing pad 16A in real-time and is then monitored.

The select circuit unit 14 is designed within an integrated circuit 11 of a wafer 10 and has a plurality of the select circuits 14A to 14N. The select circuit 14N of the select circuits 14A to 14N is a basic select circuit and the select circuits 14A to 14M are a circuit for reducing the pad. Each of the select circuits 14A to 14M is operated according to each of the test mode signals (TMS0 to TMSm) and the select circuit 14N is operated according to a logical combination signal wherein the test mode signals (TMS0 to TMSm) are logically combined. The number of the select circuits 14A to 14M is closely connected to a reduced target number of pads. For example, in case of the semiconductor device shown in FIG. 1, it is possible to reduce the number of pads by 'm' or 'n−1' than the number of pads used during wafer test according to the prior art. Furthermore, the select circuits 14A to 14M are each closely connected to the number of each test mode code. That is, the select circuits 14A to 14M have the same number as the test mode code. During wafer test, the select circuits 14A to 14N are connected to a single pad, for example the pad 16A in order to receive the test signal from the test system 30 and is one-to-one connected to the respective internal circuits 12A to 12N in order to selectively transmit the test signal received from the pad 16A to the internal circuits 12A to 12N.

Generally, the test signal is supplied from the test channel 30A of the test system 30 to the pad 16A through the probe card 20. For example, the test signal is changed depending on voltage and current characteristics of the internal circuits 12A to 12N selected by the test mode code. Further, the test signal is varied depending on the test mode signals (TMS0 to TMSm). The test mode code is generated by a combination of address signals (ADD0 to ADD7) in the test mode. The number of the address used in the test mode may be changed depending on a design. In general, in the event that 13 address signals (i.e., ADD0 to ADD12) are used, the address signal used to generate the test mode signals (TMS0 to TMSm) of the present invention may include 'ADD0 to ADD6' and 'ADD8 to ADD12' except for 'ADD7'. For convenience's sake, however, only the address signals of 'ADD0 to ADD6' are used. In addition, the address signals of 'ADD8 to ADD12' are used for other test mode (for example, burn-in test). The test mode starts when the address signal (ADD7) shifts to a High state in the mode resister setting command signal (MRS). If the MRS is at a Low state, a common operating mode such as a common read operation or a write operation starts.

Figure 4:
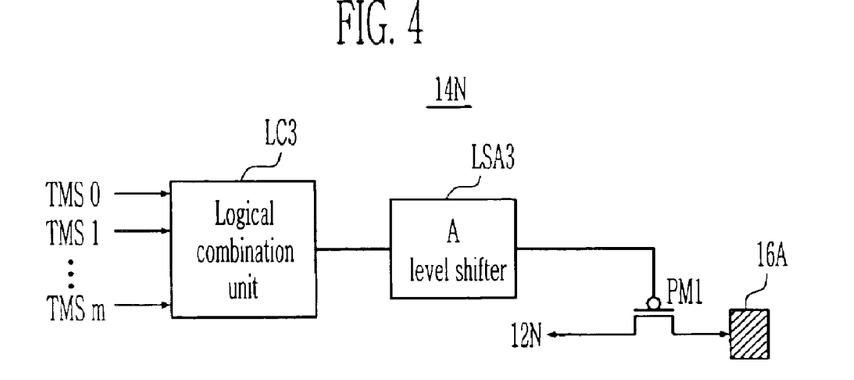
FIG. 4 is a detailed circuit diagram exemplarily illustrating the select circuit 14N shown in FIG. 1.

The select circuit 14N being the basic select circuit will be described below. The select circuit 14N may be constructed using various circuits depending on an activation state of the test mode signals (TMS0 to TMSm). For example, if the test mode signals (TMS0 to TMSm) are activated to be a High state, the circuit such as FIG. 2 and FIG. 4 is constructed.

Figure 2:
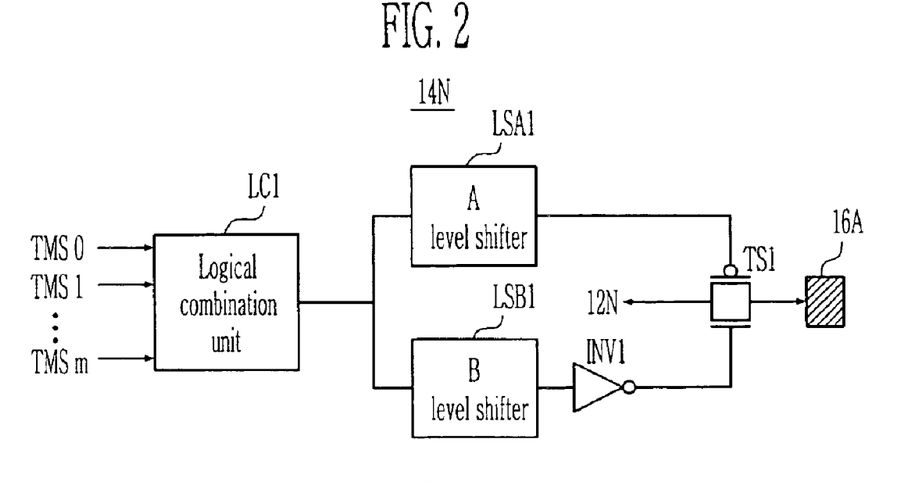
FIG. 2 is a detailed circuit diagram exemplarily illustrating the select circuit 14N shown in FIG. 1.

For instance, the select circuit 14N includes a logical combination unit LC1, level shifters A/B LSA1 and LSB1, and a transmission gate TS1, as shown in FIG. 2. The select circuit 14N further has an inverter INV1 for inverting the output of the level shifter LSB1. As one example, the select circuit 14N consists of a logical combination unit LC3, a level shifter LSA3 and a p-channel MOSFET (hereinafter referred to as 'PMOS transistor') PM1, as shown in FIG. 4. The select circuit 14N operates when all the test mode signals (TMSO to TMSm) are inputted as a Low state. That is, in case where the test mode signals (TMSO to TMSm) are all inputted as the Low state, remaining select circuits 14A to 14M except for the select circuit 14N do not operate. Accordingly, in the event that all the test mode signals (TMS0 to TMSm) are inputted as the Low state, the test signal inputted through the pad 16A is transmitted to the internal circuit 12N only.

Figure 6A:
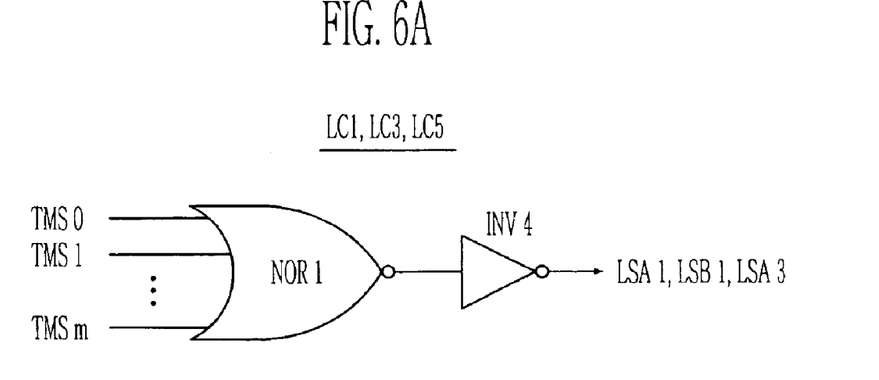
FIGS. 6A and 6B are detailed circuit diagrams exemplarily illustrating logical combination units LC1 and LC3 shown in FIG. 2 and FIG. 4.
Figure 6B:
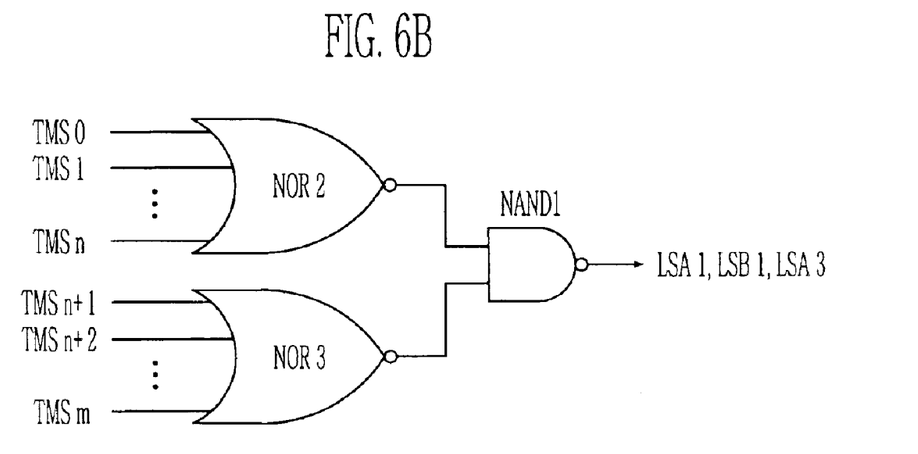

In the above, each of the logical combination units LC1 and LC3 is constructed to output the output signal of a Low state when both the test mode signals (TMS0 to TMSm) are inputted as a Low state. That is, each of the logical combination units LC1 and LC3 includes a NOR gate NOR1 for performing a NOR operation on the test mode signals (TMS0 to TMSm) and inverter INV4 for inverting the output of the NOR gate NOR1, as shown in FIG. 6A. Each of the logical combination units LC1 and LC3 includes a NOR gate NOR2 for performing a NOR operation on the test mode signals (TMS0 to TMSn; m>n), a NOR gate NOR3 for performing a NOR operation on the test mode signals (TMSn+1 to TMSm), and a NAND gate NAND1 for performing a NAND operation on the output of the NOR gate NOR2 and the output of the NOR gate NOR3, as shown in FIG. 6B.

Figure 12:
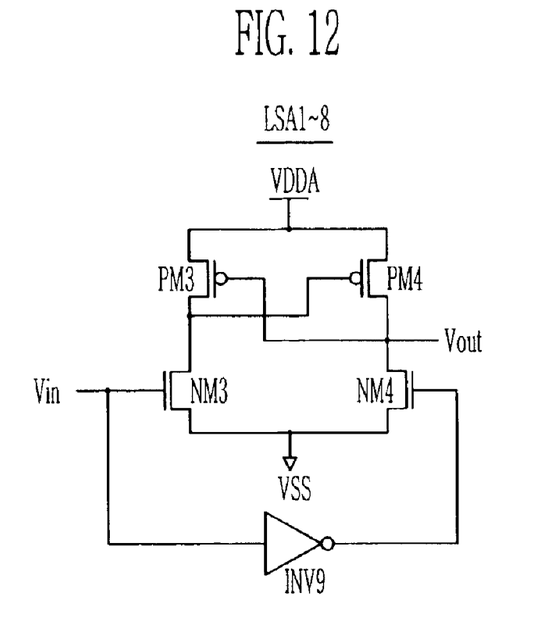
FIG. 12 is a detailed circuit diagram illustrating an 'A' level shifter shown in FIG. 2, FIG. 3, FIG. 4, FIG. 8, FIG. 9 and FIG. 10.

Level shifters LSA1 and LSA3 level up the output signals inputted from the logical combination unit LC1 and LC3. In general, they are for preventing malfunction by the leakage current that may take place in the transmission gate TS1 or the PMOS transistor PM1. Each of the level shifters LSA1 and LSA3 includes n-channel MOSFETs (hereinafter referred to as 'NMOS transistor') NM3 and NM4, PMOS transistors PM3 and PM4, and an inverter INV9 for inverting the input signal (Vin), i.e., the output signal of the logical combination units LC1 and LC3, as shown in FIG. 12. The operations of the level shifters LSA1 and LSA3 will now be described. If the output signal (Vin) of the logical combination units LC1 and LC3 is Low, the NMOS transistor NM4 is turn on to output the output signal (Vout) of the Low state having a VSS voltage level. If the output signal (Vin) of the logical combination units LC1 and LC3 is High, the NMOS transistor NM3 and the PMOS transistor PM4 are sequentially turned on to output the output signal (Vout) of the High state having a 'VDDA' voltage level. Meanwhile, the level shifter LSB1 includes PMOS transistors PM5 and PM6, NMOS transistors NM5 and NM6, and an inverter INV10 for inverting the input signal (Vin), i.e., the output signal of the logical combination unit LC1. The operation of the level shifter LSB1 will now be described. If the output signal (Vin) is a Low state of the logical combination unit LC1, the PMOS transistor PM5 and the NMOS transistor NM6 are sequentially turned on to output the output signal (Vout) of the Low state having a VDDC (having a lower voltage than VSS) voltage level. If the output signal (Vin) of the logical combination unit LC1 is a High state, the PMOS transistor PM6 is turned on to output the output signal (Vout) of the High state having a VDDB (having the same voltage as VDDA) voltage level.

Figure 3:
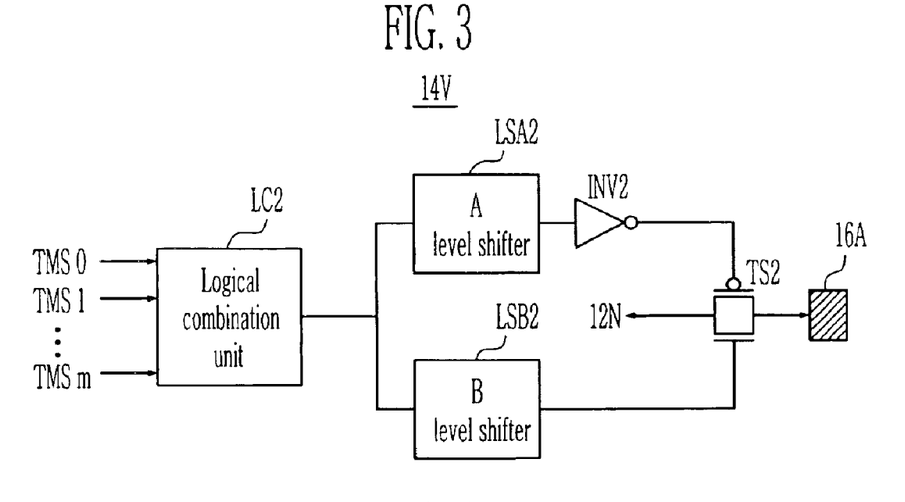
FIG. 3 is a detailed circuit diagram exemplarily illustrating the select circuit 14N shown in FIG. 1.
Figure 5:
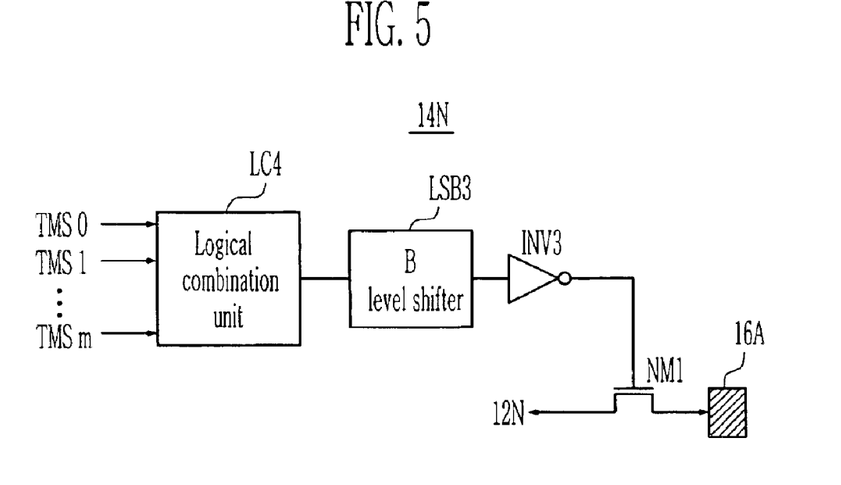
FIG. 5 is a detailed circuit diagram exemplarily illustrating the select circuit 14N shown in FIG. 1.

Meanwhile, in case where the test mode signals (TMS0 to TMSm) are activated as the Low state, a select circuit 14N being the basic select circuit is constructed as shown in FIG. 3 and FIG. 5.

As one example, as shown in FIG. 3, the select circuit 14N includes a logical combination unit LC2, level shifters LSA2 and LSB2 and a transmission gate TS2. Further, the select circuit 14N includes an inverter INV2 for inverting the output of the level shifter LSA2. As another example, as shown in FIG. 5, the select circuit 14N includes a logical combination unit LC4, a level shifter LSB3 and a PMOS transistor NM1. The select circuit 14N is constructed to operate when all the test mode signals (TMS0 to TMSm) are inputted as the High state. That is, if the test mode signals (TMS0 to TMSm) are all inputted as the High state, the select circuits 14A to 14M except for the select circuit 14N do not operate. On the contrary, if at least one of the test mode signals (TMS0 to TMSm) is inputted as a Low state, the select circuit 14N does not operate. Accordingly, if the test mode signals (TMS0 to TMSm) are all inputted as the Low state, the test signal inputted through the pad 16A is transmitted only to the internal circuit 12N via the select circuit 14N.

Figure 7A:
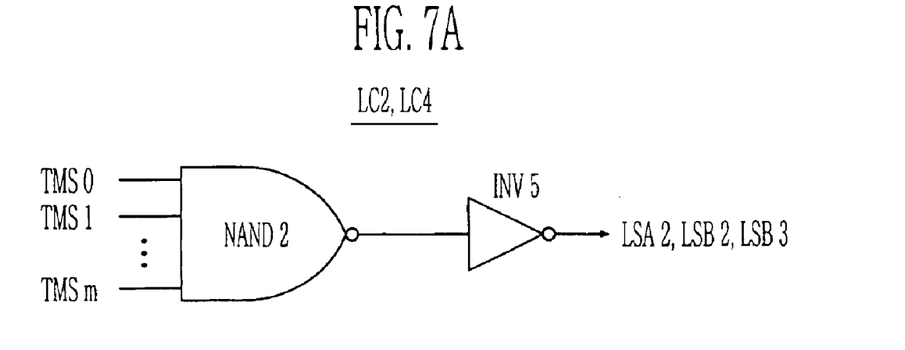
FIGS. 7A and 7B are detailed circuit diagrams exemplarily illustrating logical combination units LC2 and LC34 shown in FIG. 3 and FIG. 5.
Figure 7B:
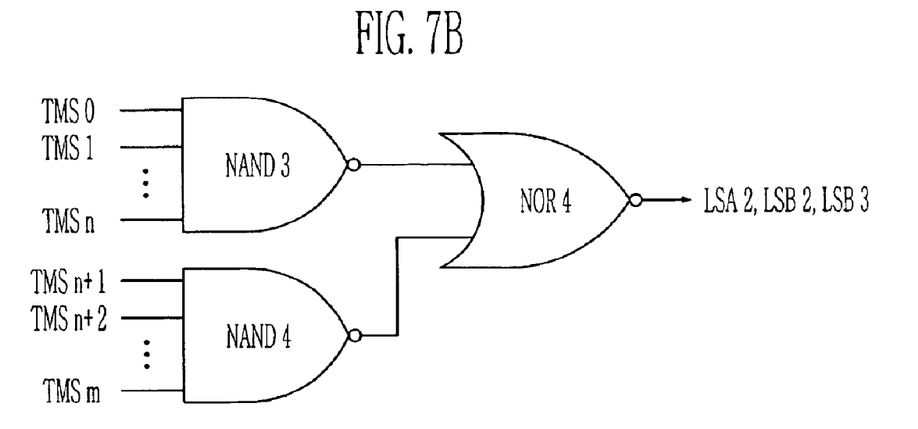

In the above, the logical combination units LC2 and LC4 are constructed to output the output signal of the High state when the test mode signals (TMS0 to TMSm) are all inputted as the High state. That is, as shown in FIG. 7A, each of the logical combination units LC2 and LC4 includes a NAND gate NAND2 for performing a NAND operation on the test mode signals (TMS0 to TMSm) and an inverter INV5 for inverting the output of the NAND gate NAND2. Further, as shown in FIG. 7B, each of the logical combination units LC2 and LC4 includes a NAND gate NAND3 for performing a NAND operation on the test mode signals (TMS0 to TMSn; m>n), a NAND gate NAND4 for performing a NAND operation on the test mode signals (TMSn+1 to TMSm), and a NOR gate NOR4 for performing a NOR operation on the outputs of the NAND gate NAND3 and the NAND gate NAND4. The level shifter LSA2 has the same construction and operation as those of the level shifters LSA1 and LSA3 described above. Further, the level shifters LSB2 and LSB3 has the same construction and operation as the level shifter LSB1. Explanation on them will be omitted for simplification.

The select circuits 14A to 14M will now be described. The select circuits 14A to 14M are constructed variously depending on an activation state of the test mode signals (TMS0 to TMSm) similarly to the select circuit 14N being the basic select circuit. For example, if the test mode signals (TMS0 to TMSm) are activated as a High state, the circuit is constructed like FIG. 8 and FIG. 10.

Figure 8:
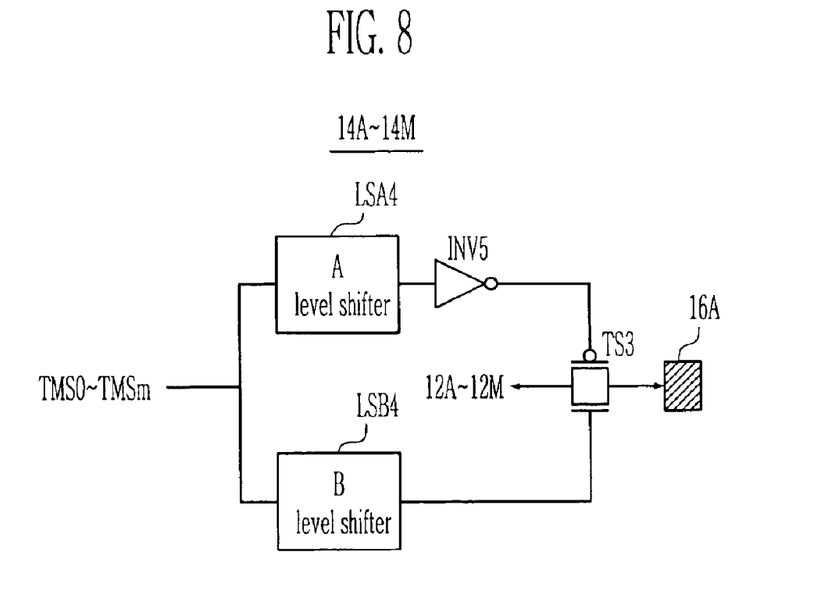
FIG. 8 is a detailed circuit diagram exemplarily illustrating the select circuits 14A to 14M shown in FIG. 1.
Figure 10:
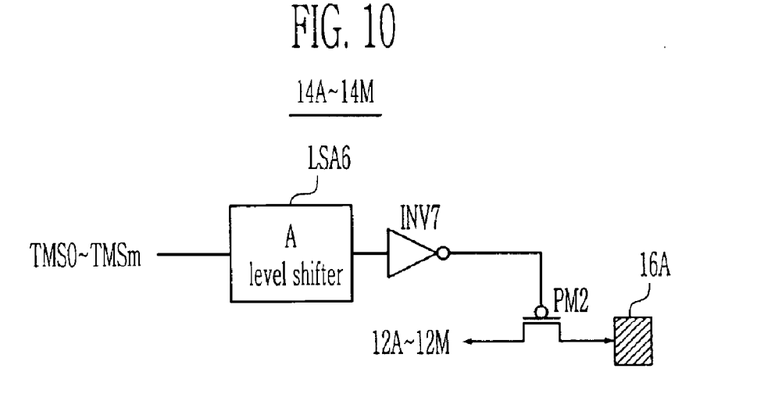
FIG. 10 is a detailed circuit diagram exemplarily illustrating the select circuits 14A to 14M shown in FIG. 1.

As one example, as shown in FIG. 8, each of the select circuits 14A to 14M includes level shifters LSA4 and LSB4 and a transmission gate TS3. Each of the select circuits 14A to 14M further includes an inverter INV5 for inverting the output of the level shifter LSA4. As another example, each of the select circuits 14A to 14M includes a level shifter LSA6, an inverter INV7 for inverting the output of the level shifter LSA6, and a PMOS transistor PM2 driven depending on the output of the inverter INV7, as shown in FIG. 10.

Each of the level shifters LSA4 and LSA6 consists of a circuit shown in FIG. 12. The level shifter LSB4 consists of a circuit shown in FIG. 13. The select circuits 14A to 15M are constructed to operate when the test mode signals (TMS0 to TMSm) are inputted as a High state. For example, in case where only the test mode signal (TMS0) of the test mode signals (TMS0 to TMSm) is inputted as a High state and the remaining test mode signals (TMS1 to TMSm) are inputted as a Low state, only the select circuit 14A of the select circuits 14A to 14M operates.

Figure 9:
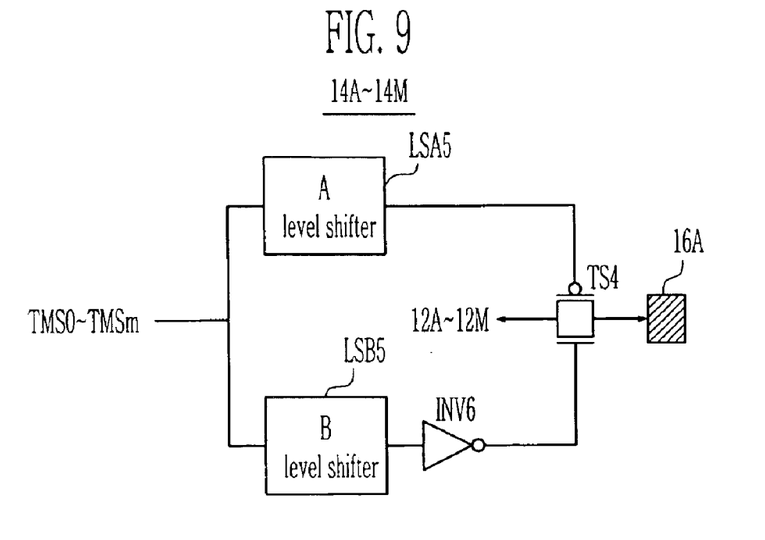
FIG. 9 is a detailed circuit diagram exemplarily illustrating the select circuits 14A to 14M shown in FIG. 1.
Figure 11:
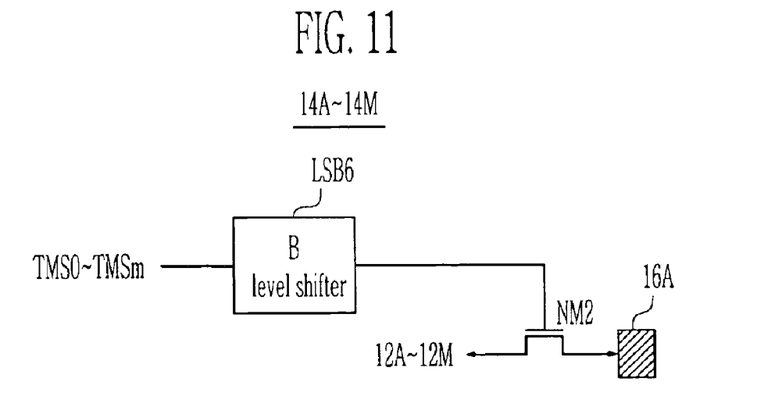
FIG. 11 is a detailed circuit diagram exemplarily illustrating the select circuits 14A to 14M shown in FIG. 1.

Meanwhile, if the test mode signals (TMS0 to TMSm) are inputted as a Low state, the select circuits 14A to 14M are constructed like circuits shown in FIG. 9 and FIG. 11.

As one example, each of the select circuits 14A to 14M includes level shifters LSA5 and LSB5 and a transmission gate TS4, as shown in FIG. 9. Further, each of the select circuits 14A to 14M includes an inverter INV6 for inverting the output of the level shifter LSB5. As another example, each of the select circuits 14A to 14M includes a level shifter LSB6 and a NMOS transistor NM2 driven depending on the output of the level shifter LSB6, as shown in FIG. 11. The level shifter LSA5 consists of a circuit shown in FIG. 12 and the level shifters LSB5 and LSB6 consists of a circuit shown in FIG. 13. The select circuit 14A to 15M is constructed to operate when the test mode signals (TMS0 to TMSm) are inputted as a Low state. For example, in the event that only the test mode signal (TMS0) of the test mode signals (TMS0 to TMSm) is inputted as a Low state and the remaining test mode signals (TMS1 to TMSm) are all inputted as a High state, only the select circuit 14A of the select circuits 14A to 14M operates.

The operation of the semiconductor device constructed above according to the preferred embodiment of the present invention will be described. As one example, a semiconductor device capable of reducing two probing pads when the test mode signals (TMS0 and TMS1) are activated to be a High state will be described.

Figure 14:
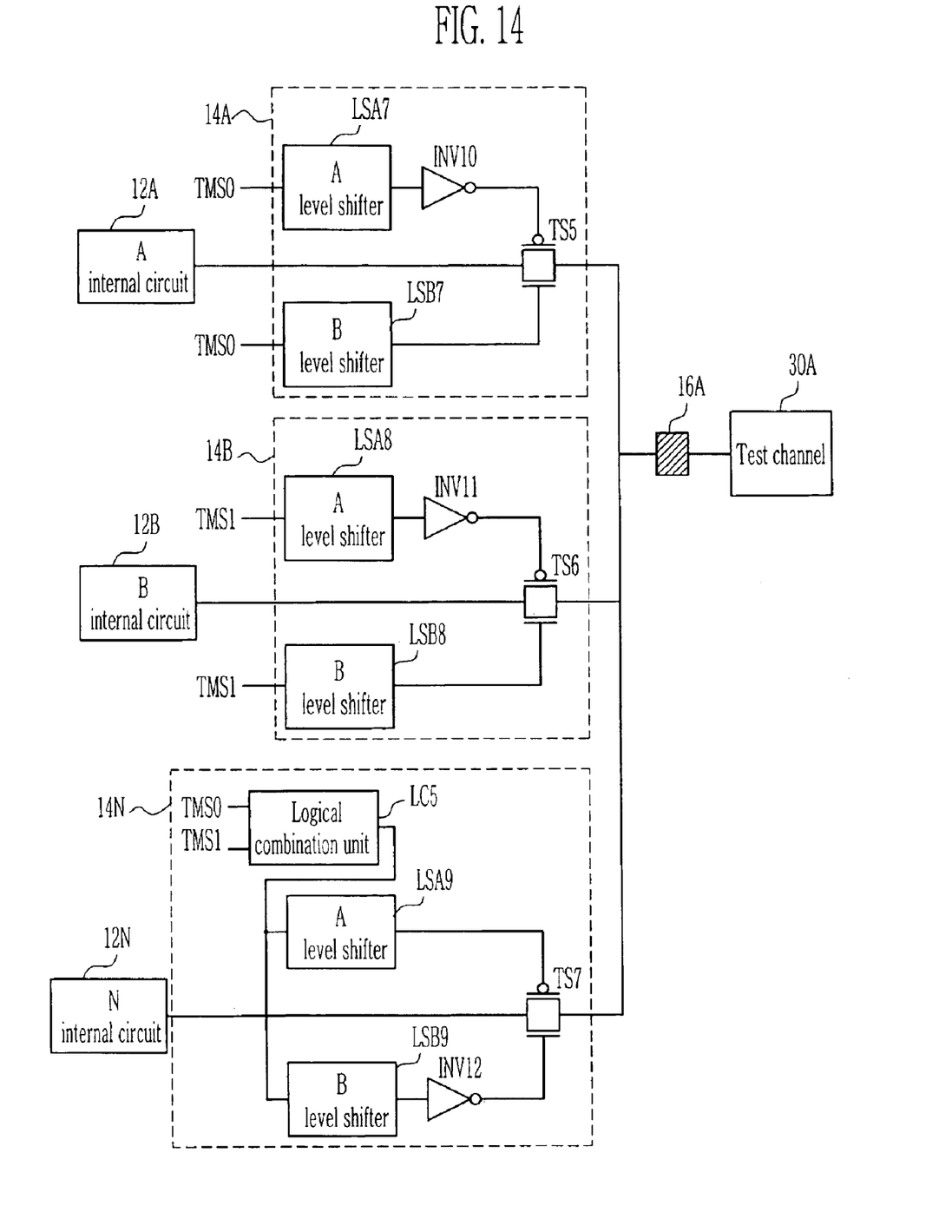
FIG. 14 is a detailed circuit diagram for explaining operating characteristics of the semiconductor device according to a preferred embodiment.

As shown in FIG. 14, a case where a semiconductor device having the select circuit 14N that basically operates when the test mode signals (TMS0 and TMS1) are not activated and the select circuits 14A and 14B that operate when the test mode signals (TMS0 and TMS1) are activated, will be explained as an example.

TABLE 1

| TMS0 | TMS1 | Select Circuit 14A | Select Circuit 14B | Select Circuit 14N | Internal Circuit 12A | Internal Circuit 12B | Internal Circuit 12N |
|---|---|---|---|---|---|---|---|
| 0 | 0 | operation (X) | operation (X) | operation (O) | select(X) | select(X) | select(O) |
| 0 | 1 | operation (X) | operation (O) | operation (X) | select(X) | select(O) | select(X) |
| 1 | 0 | operation (O) | operation (X) | operation (X) | select(O) | select(X) | select(X) |
| X | X | X | X | X | X | X | X |

As shown in Table 1, if both the test mode signals (TMS0 and TMS1) are generated as a Low state through the test mode coding and are then inputted to the select circuits 14A to 14N, the select circuits 14A and 14B do not operate but the select circuit 14N operates. That is, in case where both the test mode signals (TMS0 and TMS1) become inactivated and are then inputted as the Low state, only the internal circuit 12N being a basic circuit to be tested during wafer test is tested.

Figure 13:
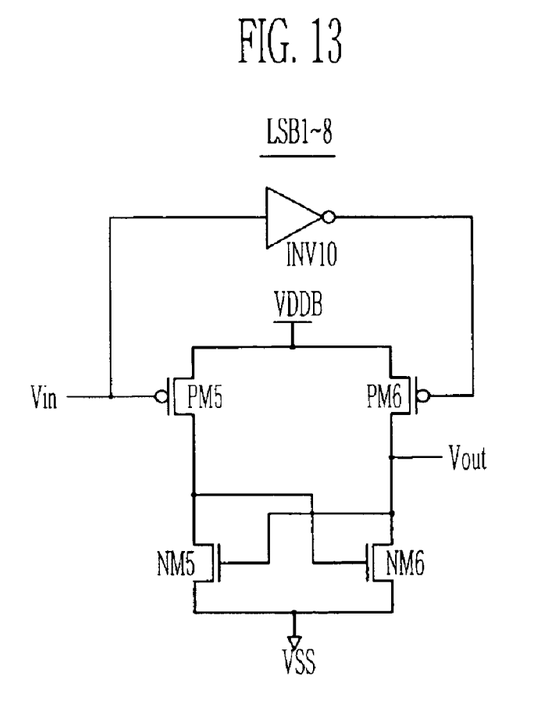
FIG. 13 is a detailed circuit diagram illustrating a 'B' level shifter shown in FIG. 2, FIG. 3, FIG. 5, FIG. 8, FIG. 9 and FIG. 11.

In the concrete, the test mode signal (TMS0) is inputted to each of the level shifters LSA7 and LSB7 as a Low state. As shown in FIG. 12, the level shifter LSA7 uses the test mode signal (TMS0) to output a Low signal of the 'VSS' voltage level. As shown in FIG. 13, the level shifter LSB7 also outputs the Low signal of the 'VSS' voltage level. The Low signal outputted from the level shifter LSA7 is inverted to a High state by means of the inverter INV10. In other words, the High signal is inputted to a gate electrode of a PMOS transistor of the transmission gate TS5 and the Low signal is inputted to a gate electrode of a NMOS transistor of the transmission gate TS5. Therefore, transmission of the transmission gate TS5 does not operate. Accordingly, the test signal supplied from the test channel 30A through the pad 16A to the internal circuit 12A is precluded. As a result, the internal circuit 12A is not selected by the select circuit 14A that does not operate during wafer test. Like in the select circuit 14A, the select circuit 14B is not operated by the test mode signal (TMS1) of the Low state. Accordingly, the internal circuit 12B is not selected during wafer test. On the contrary, the select circuit 14N operates. In the concrete, as the test mode signals (TMS0 and TMS1) are inputted to the logical combination unit LC5 as the Low state, the logical combination unit LC5 outputs the Low signal as shown in FIG. 6A. If the Low signal is inputted, the level shifter LSA9 outputs the Low signal of the 'VSS' voltage level, as shown in FIG. 12, and the level shifter LSB9 outputs the Low signal of the 'VSS' voltage level, as shown in FIG. 13. Thereafter, the output of the level shifter LSB9 is inverted to a High state by means of the inverter INV12. That is, the Low signal is inputted to a gate electrode of a PMOS transistor of the transmission gate TS7 and the High signal is inputted to a gate electrode of a NMOS transistor of the transmission gate TS7. Accordingly, the transmission gate TS7 operates. The test signal supplied from the test channel 30 A through the pad 16A is transmitted to the internal circuit 12N being the basic circuit to be test.

Meanwhile, as shown in Table 1, if the test mode signal (TMS0) is outputted as a Low state and the test mode signal (TMS1) is outputted as a High state through the test mode coding and are then inputted to the select circuits 14A to 14N, the select circuits 14A and 14N does not operate but the select circuit 14B operates. That is, in the event that the test mode signal (TMSO) is inactivated and is inputted as the Low state and the test mode signal (TMS1) is activated and is inputted as the High state, only the internal circuit 12B is tested during wafer test. On the contrary, if the test mode signal (TMS0) is outputted as a High state and the test mode signal (TMS1) is outputted as a Low state through the test mode coding and are then inputted the select circuits 14A to 14N, the select circuits 14B and 14N do not operate but the select circuit 14A operates. In other words, in the event that the test mode signal (TMSO) is activated and is inputted as the High state and the test mode signal (TMS1) is inactivated and is inputted as the Low state, only the internal circuit 12A is tested during wafer test.

The select circuits 14A to 14N in the disclosed semiconductor device include the level shifters. However, it should be noted that this is only for increasing the operating characteristic of the semiconductor device and this is not intended to limit the preset invention. For example, the select circuits 14A to 14N of the semiconductor device according to the preferred embodiment of the present invention may not include the level shifters but include only the switching means such as the transmission gate, the PMOS transistor or the NMOS transistor. In this case, the inverter may be adequately constructed depending on the switching means used. That is, the test signal inputted to the probing pad can be transmitted to a corresponding internal circuit, by constructing the select circuits 14A to 14N using only the switching means driven by the test mode signals (TMSO to TMSm). As described above, the reason why the level shifters are included in the select circuits 14A to 14N is for preventing malfunction due to the leakage current generated in each of the switching means. In other words, it is possible to prevent such malfunction of the switching means by certainly leveling up or down the test mode signals (TMS0 to TMSm) through the level shifter.

The difference in the operating characteristics between the disclosed semiconductor device and the common semiconductor device according to the prior art will now be described.

As described above, in the prior art, the operation is performed in a manner that the internal circuit that will be tested using a plurality of the pads during wafer test is selected. In other words, in the prior art, each pad is allocated every internal circuit to be tested. This is because electrical characteristics for an internal circuit are different. Each of the internal circuits is one-to-one connected to a corresponding pad. The test is carried out by means of the test signals (address signal, command signal, DQ signal or voltage) inputted through the corresponding pad in the test mode. For example, if the internal circuit to be tested is a circuit (hereinafter referred to as 'first internal circuit') that is driven by the VPP voltage, the test signal corresponding to the VPP voltage is applied from the test system to a corresponding pad (hereinafter referred to as 'first pad') in order to test whether the first internal circuit smoothly operates in the VPP voltage. The first internal circuit uses the VPP voltage from the first pad to perform the test operation. Thereafter, if the internal circuit (hereinafter referred to as 'second internal circuit') driven by a VBLP (having different voltage level from VPP) voltage is to be tested, the test operation is performed using the test signal corresponding to the VBLP voltage through a pad for test (hereinafter referred to 'second pad') through the second internal circuit. As such, in the prior art, the test operation is performed using each pad that is predetermined every internal circuit that will be tested during wafer test. The number of the pad is increased to that extent.

On the contrary, in the semiconductor device described above, the test operation is performed in a manner that the internal circuit to be tested is selected using the test mode signal generated during wafer test. In other words, in the disclosed device, the test operation is not performed with the internal circuit selected by each pad that is previously set during wafer test as in the prior art, but is performed with the internal circuit selected by the test mode signal. For example, as shown in FIG. 14, the internal circuit 12N being a basic circuit is tested by the VPP voltage, the internal circuit 12A is a circuit tested by the VBLP voltage, and the internal circuit 12B is a circuit tested by the VCORE (voltage having different voltage level from VPP and VBLP) voltage. Further, the pad 16A is the pad that is previously set in order to test the internal circuit 12N. If only the internal circuit 12N is to be tested during wafer test, the test mode signals (TMS0 and TMS1) are inactivated to operate only the select circuit 14N. Thus the test signal corresponding to the VPP voltage is supplied to the internal circuit 12N through the pad 16A and only the internal circuit 12N is tested accordingly. Thereafter, if the internal circuit 12A is to be tested, only the test mode signal (TMS0) is activated to operate only the select circuit 14A. Thus the test signal corresponding to the VBLP voltage is supplied to the internal circuit 12A through the pad 16A and only the internal circuit 12A is tested accordingly.

It is therefore possible to reduce the probing pads of the integrated circuit that is used for connection to a single probe for contact of the probe card during wafer test using the test system.

Further, during wafer test using the test system, a large number of integrated circuits greater than the number of test channels are tested using a limited number of the test channels. It is therefore possible to shorten test time.

Although the foregoing description has been made with reference to the preferred embodiments, it is to be understood that changes and modifications of the present invention may be made by the ordinary skilled in the art without departing from the spirit and scope of the present invention and appended claims.

What is claimed is:

1. A semiconductor device, comprising:
   an internal circuit block provided on a die, each internal circuit block having a plurality of internal circuits; and
   a select circuit unit also disposed on the die for selectively transmitting test signals inputted through a pad to any one of the internal circuits of the internal circuit block according to test mode signals generated during a wafer test, the select circuit unit including a plurality of select circuits.

2. The semiconductor device as claimed in claim 1, wherein the select circuit unit comprises:
   one or more first select circuit(s) driven according to any one of the test mode signals; and
   a second select circuit driven according to a logical combination signal of the test mode signals.

3. The semiconductor device as claimed in claim 2, wherein a number of the first select circuits equals a number of the test mode signals.

4. The semiconductor device as claimed in claim 2, wherein the first select circuits are operated when a corresponding test mode signal inputted among the test mode signals is activated.

5. The semiconductor device as claimed in claim 2, wherein the second select circuit is operated when all the test mode signals are inactivated.

6. The semiconductor device as claimed in claim 2, wherein each of the first select circuits comprises:
   a first level shifter and a second level shifter for leveling up or down a corresponding test mode signal inputted among the test mode signals;
   an inverter for inverting an output signal of the first level shifter; and
   a transmission gate operated according to an output signal of the inverter and an output signal of the second level shifter, for transmitting the test signals inputted from the probing pads to the internal circuit of any one of corresponding internal circuit blocks.

7. The semiconductor device as claimed in claim 6, wherein the first level shifter outputs its output signal in a High state that is leveled up if the input signal is the High state, and outputs its output signal in a Low state that is leveled down if the input signal is in the Low state.

8. The semiconductor device as claimed in claim 6, wherein the second level shifter outputs its output signal in a High state that is leveled up if the input signal is in the High state, and outputs its output signal in a Low state that is leveled down if the input signal is the Low state.

9. The semiconductor device as claimed in claim 2, wherein each of the first select circuits comprises:

a first level shifter and a second level shifter for leveling up or down a corresponding test mode signal inputted among the test mode signals;
an inverter for inverting an output signal of the second level shifter; and
a transmission gate operated according an output signal of the first level shifter and the output signal of the inverter, for transmitting the test signals inputted from the probing pads to the internal circuit of any one of corresponding internal circuit blocks.

10. The semiconductor device as claimed in claim 9, wherein the first level shifter outputs its output signal in a High state that is leveled up if the input signal is in the High state, and outputs its output signal in a Low state that is leveled down if the input signal is in the Low state.

11. The semiconductor device as claimed in claim 9, wherein the second level shifter outputs its output signal in a High state that is leveled up if the input signal is in the High state, and outputs its output signal in a Low state that is leveled down if the input signal is in the Low state.

12. The semiconductor device as claimed in claim 2, wherein each of the first select circuits comprises:
   a first level shifter for leveling up or down a corresponding test mode signal inputted among the test mode signals;
   an inverter for inverting an output signal of the first level shifter; and
   a PMOS transistor operated according to an output signal of the inverter, for transmitting the test signals inputted from the probing pads to the internal circuit of any one of corresponding internal circuit blocks.

13. The semiconductor device as claimed in claim 12, wherein the first level shifter outputs its output signal in a High state that is leveled up if the input signal is in the High state, and outputs the output signal in a Low state that is leveled down if the input signal is in the Low state.

14. The semiconductor device as claimed in claim 2, wherein each of the first select circuits comprises:
   a second level shifter for leveling up or down a corresponding test mode signal inputted among the test mode signals; and
   a NMOS transistor operated according the output signal of the second level shifter, for transmitting the test signals inputted from the probing pads to the internal circuit of any one of corresponding internal circuit blocks.

15. The semiconductor device as claimed in claim 14, wherein the second level shifter outputs its output signal in a High state that is leveled up if the input signal is in the High state, and outputs its output signal in a Low state that is leveled down if the input signal is in the Low state.

16. The semiconductor device as claimed in claim 2, wherein the second select circuit comprises:
   a logical combination unit for logically combining the test mode signals;
   a first level shifter and a second level shifter for leveling up or down an output signal of the logical combination unit;
   an inverter for inverting an output signal of the second level shifter; and
   a transmission gate operated according to an output signal of the first level shifter and an output signal of the inverter, for transmitting the test signals inputted from the probing pads to the internal circuit of any one of corresponding internal circuit blocks.

17. The semiconductor device as claimed in claim 16, wherein the first level shifter outputs the output signal of a High state that is leveled up if the input signal is the High state, and outputs the output signal of a Low state that is leveled down if the input signal is the Low state.

18. The semiconductor device as claimed in claim 16, wherein the second level shifter outputs the output signal of a High state that is leveled up if the input signal is the High state, and outputs the output signal of a Low state that is leveled down if the input signal is the Low state.

19. The semiconductor device as claimed in claim 16, wherein the logical combination unit outputs a Low state when all the test mode signals are at a Low state, and outputs a High state when all the test mode signals are at a High state.

20. The semiconductor device as claimed in claim 16, wherein the logical combination unit comprises:
   a NAND gate for performing a NAND operation on the test mode signals; and
   an inverter for inverting the output of the NAND gate.

21. The semiconductor device as claimed in claim 16, wherein the logical combination unit comprises:
   a NOR gate for performing a NOR operation on the test mode signals; and
   an inverter for inverting the output of the NOR gate.

22. The semiconductor device as claimed in claim 16, wherein the logical combination unit comprises:
   a first NAND gate for performing a NAND operation on some of the test mode signals;
   a second NAND gate for performing a NAND operation on the remaining test mode signals that are not inputted to the first NAND gate, of the test mode signals; and
   an inverter for inverting the output signal of the first NAND gate and the output signal of the second NAND gate.

23. The semiconductor device as claimed in claim 16, wherein the logical combination unit comprises:
   a first NOR gate for performing a NOR operation on some of the test mode signals;
   a second NOR gate for performing a NOR operation on the remaining test mode signals that are not inputted to the first NOR gate, of the test mode signals; and
   an inverter for inverting the output signal of the first NOR gate and the output signal of the second NOR gate.

24. The semiconductor device as claimed in claim 2, wherein the second select circuit comprises:
   a logical combination unit for logically combining the test mode signals;
   a first level shifter and a second level shifter for leveling up or down an output signal of the logical combination unit;
   an inverter for inverting an output signal of the first level shifter; and
   a transmission gate operated according to an output signal of the second level shifter and an output signal of the inverter, for transmitting the test signals inputted from the probing pads to the internal circuit of any one of corresponding internal circuit blocks.

25. The semiconductor device as claimed in claim 24, wherein the first level shifter outputs its output signal in a High state that is leveled up if the input signal is in the High state, and outputs its output signal of a Low state that is leveled down if the input signal is in the Low state.

26. The semiconductor device as claimed claim 24, wherein the second level shifter outputs its output signal in a High state that is leveled up if the input signal is the High state, and outputs its output signal in a Low state that is leveled down if the input signal is the Low state.

27. The semiconductor device as claimed in claim 24, wherein the logical combination unit outputs a Low state output signal when all the test mode signals are in a Low state, and outputs a High state output signal when all the test mode signals are in a High state.

28. The semiconductor device as claimed in claim 24, wherein the logical combination unit comprises:
   a NAND gate for performing a NAND operation on the test mode signals; and
   an inverter for inverting the output of the NAND gate.

29. The semiconductor device as claimed in claim 24, wherein the logical combination unit comprises:
   a NOR gate for performing a NOR operation on the test mode signals; and
   an inverter for inverting the output of the NOR gate.

30. The semiconductor device as claimed in claim 24, wherein the logical combination unit comprises:
   a first NAND gate for performing a NAND operation on some of the test mode signals;
   a second NAND gate for performing a NAND operation on the remaining test mode signals that are not inputted to the first NAND gate, of the test mode signals; and
   an inverter for inverting the output signal of the first NAND gate and the output signal of the second NAND gate.

31. The semiconductor device as claimed in claim 24, wherein the logical combination unit comprises:
   a first NOR gate for performing a NOR operation on some of the test mode signals;
   a second NOR gate for performing a NOR operation on the remaining test mode signals that are not inputted to the first NOR gate, of the test mode signals; and
   an inverter for inverting the output signal of the first NOR gate and the output signal of the second NOR gate.

32. The semiconductor device as claimed in claim 2, wherein the second select circuit comprises:
   a logical combination unit for logically combining the test mode signals;
   a first level shifter for leveling up or down the an output signal of the logical combination unit; and
   a PMOS transistor operated according to the an output signal of the first level shifter, for transmitting the test signal inputted from the probing pad to the internal circuit of any one of corresponding internal circuit blocks.

33. The semiconductor device as claimed in claim 32, wherein the first level shifter outputs its output signal in a High state that is leveled up if the input signal is in the High state, and outputs its output signal in a Low state that is leveled down if the input signal is in the Low state.

34. The semiconductor device as claimed in claim 32, wherein the logical combination unit outputs a Low state output signal when all the test mode signals are in a Low state, and outputs a High state output signal when all the test mode signals are in a High state.

35. The semiconductor device as claimed in claim 32, wherein the logical combination unit comprises:
   a NAND gate for performing a NAND operation on the test mode signals; and
   an inverter for inverting the output of the NAND gate.

36. The semiconductor device as claimed in claim 32, wherein the logical combination unit comprises:
 a NOR gate for performing a NOR operation on the test mode signals; and
 an inverter for inverting the output of the NOR gate.

37. The semiconductor device as claimed in claim 32, wherein the logical combination unit comprises:
 a first NAND gate for performing a NAND operation on some of the test mode signals;
 a second NAND gate for performing a NAND operation on the remaining test mode signals that are not inputted to the first NAND gate, of the test mode signals; and
 an inverter for inverting the output signal of the first NAND gate and the output signal of the second NAND gate.

38. The semiconductor device as claimed in claim 32, wherein the logical combination unit comprises:
 a first NOR gate for performing a NOR operation on some of the test mode signals;
 a second NOR gate for performing a NOR operation on the remaining test mode signals that are not inputted to the first NOR gate, of the test mode signals; and
 an inverter for inverting an output signal of the first NOR gate and an output signal of the second NOR gate.

39. The semiconductor device as claimed in claim 2, wherein the second select circuit comprises:
 a logical combination unit for logically combining the test mode signals;
 a second level shifter for leveling up or down an output signal of the logical combination unit;
 an inverter for inverting an output signal of the second level shifter; and
 a NMOS transistor operated according to an output signal of the inverter, for transmitting the test signals inputted from the probing pads to the internal circuit of any one of corresponding internal circuit blocks.

40. The semiconductor device as claimed in claim 39, wherein the second level shifter outputs its output signal in a High state that is leveled up if the input signal is in the High state, and outputs its output signal of a Low state that is leveled down if the input signal is in the Low state.

41. The semiconductor device as claimed in claim 39, wherein the logical combination unit outputs in a Low state when all the test mode signals are in a Low state, and outputs in a High state when all the test mode signals are in a High state.

42. The semiconductor device as claimed in claim 39, wherein the logical combination unit comprises:
 a NAND gate for performing a NAND operation on the test mode signals; and
 an inverter for inverting the output of the NAND gate.

43. The semiconductor device as claimed in claim 39, wherein the logical combination unit comprises:
 a NOR gate for performing a NOR operation on the test mode signals; and
 an inverter for inverting the output of the NOR gate.

44. The semiconductor device as claimed in claim 39, wherein the logical combination unit comprises:
 a first NAND gate for performing a NAND operation on some of the test mode signals;
 a second NAND gate for performing a NAND operation on the remaining test mode signals that are not inputted to the first NAND gate, of the test mode signals; and
 an inverter for inverting an output signal of the first NAND gate and the output signal of the second NAND gate.

45. The semiconductor device as claimed in claim 39, wherein the logical combination unit comprises:
 a first NOR gate for performing a NOR operation on some of the test mode signals;
 a second NOR gate for performing a NOR operation on the remaining test mode signals that are not inputted to the first NOR gate, of the test mode signals; and
 an inverter for inverting an output signal of the first NOR gate and an output signal of the second NOR gate.

46. The semiconductor device as claimed in claim 2, wherein the first select circuit consists of a transmission gate, a PMOS transistor or a NMOS transistor that is operated according to a corresponding test mode signal of the test mode signals, for transmitting the test signals inputted to the probing pads to the internal circuit of any one of corresponding internal circuit blocks.

47. The semiconductor device as claimed in claim 2, wherein the second select circuit consists of a transmission gate, a PMOS transistor or a NMOS transistor that is operated according to a logical combination signal in which the test mode signals are logically combined, for transmitting the test signals inputted to the probing pads to the internal circuit of any one of corresponding internal circuit blocks.

48. The semiconductor device as claimed in claim 2, wherein only one of the first select circuit and the second select circuit is operated according to the test mode signal.

49. The semiconductor device as claimed in claim 1, wherein different test signals are inputted to the probing pad according to the test mode signal.

50. The semiconductor device as claimed in claim 1, wherein the probing pad receives the test signals from a single test channel.

51. A method of testing a wafer, comprising the steps of:
 dividing an integrated circuit formed on a die into an internal circuit block and a select circuit unit;
 selectively transmitting test signals inputted through a probing pad through a select circuit of the select circuit unit and to an internal circuit of the internal circuit block according to a test mode signal generated during wafer test; and
 testing the operation of the corresponding internal circuit operated according to the transmitted test signal through the probing pads, by monitoring it.

52. The method as claimed in claim 51, wherein different test signals are inputted to the probing pad according to the test mode signal.

53. The method as claimed in claim 51, wherein the probing pad receives the test signal from a single test channel.

* * * * *

UNITED STATES PATENT AND TRADEMARK OFFICE
CERTIFICATE OF CORRECTION

| | | |
|---|---|---|
| PATENT NO. | : 7,002,364 B2 | Page 1 of 1 |
| APPLICATION NO. | : 10/738691 | |
| DATED | : February 21, 2006 | |
| INVENTOR(S) | : Tae J. Kang et al. | |

It is certified that error appears in the above-identified patent and that said Letters Patent is hereby corrected as shown below:

In the Claims:

Column 11, line 66, "claimed claim" should be -- claimed in claim --.

Column 12, line 48, "to the an output" should be -- to an output --.

Signed and Sealed this

Fourteenth Day of August, 2007

JON W. DUDAS
*Director of the United States Patent and Trademark Office*